(12) United States Patent
Martinez et al.

(10) Patent No.: US 7,598,119 B2
(45) Date of Patent: Oct. 6, 2009

(54) SYSTEM AND METHOD FOR INHIBITING AND CONTAINING RESIN BLEED-OUT FROM ADHESIVE MATERIALS USED IN ASSEMBLY OF SEMICONDUCTOR DEVICES

(75) Inventors: Sergio V. Martinez, Allen, TX (US); Boon Hor Lee, Plano, TX (US); Karen Lynne Robinson, Royse City, TX (US)

(73) Assignee: Texas Instruments Incorporated, Dallas, TX (US)

( * ) Notice: Subject to any disclaimer, the term of this patent is extended or adjusted under 35 U.S.C. 154(b) by 142 days.

(21) Appl. No.: 11/716,912

(22) Filed: Mar. 12, 2007

(65) Prior Publication Data
US 2008/0225491 A1    Sep. 18, 2008

(51) Int. Cl.
*H01L 21/44*  (2006.01)
*H01L 21/48*  (2006.01)
*H01L 21/50*  (2006.01)

(52) U.S. Cl. .................. 438/106; 438/48; 438/116; 257/694; 257/706

(58) Field of Classification Search .............. 438/48, 438/106, 116, 118; 257/694, 706, 783, 788
See application file for complete search history.

(56) References Cited

U.S. PATENT DOCUMENTS

| | | | | |
|---|---|---|---|---|
| 6,331,347 | B2 * | 12/2001 | Haji | 428/209 |
| 6,627,329 | B1 * | 9/2003 | Shintani | 428/624 |
| 7,053,521 | B2 * | 5/2006 | Baumgartner | 310/311 |
| 7,183,657 | B2 * | 2/2007 | Furtaw et al. | 257/783 |
| 2005/0006700 | A1 | 1/2005 | Cao et al. | |
| 2005/0151272 | A1 | 7/2005 | Street et al. | |
| 2006/0060985 | A1 | 3/2006 | Furtaw et al. | |
| 2007/0158801 | A1 * | 7/2007 | Lee et al. | 257/678 |

* cited by examiner

*Primary Examiner*—Phuc T Dang
(74) *Attorney, Agent, or Firm*—Yingsheng Tung; Wade J. Brady, III; Frederick J. Telecky, Jr.

(57) ABSTRACT

System and method for preventing resin-based adhesive from contacting a substrate to minimize resin bleed-out and contamination. A preferred embodiment comprises a semiconductor device having a die mounted on a substrate, first and second gold surfaces formed on the substrate, a trench formed between the first and second gold surfaces, resin-based adhesive applied to the first gold surface, and a heat sink bonded to the resin-based adhesive.

7 Claims, 2 Drawing Sheets

SYSTEM AND METHOD FOR INHIBITING AND CONTAINING RESIN BLEED-OUT FROM ADHESIVE MATERIALS USED IN ASSEMBLY OF SEMICONDUCTOR DEVICES

TECHNICAL FIELD

The present invention relates generally to a system and method for containing resin that bleeds out of adhesive and, more particularly, to a system and method for preventing resin bleed-out from contaminating semiconductor devices.

BACKGROUND

During flip chip semiconductor device assembly, a die, such as a microprocessor, is mounted on a substrate. A heat sink lid is then attached on top of the die and the substrate using a lid adhesive. The lid adhesive may be any commercially available adhesive, such as Lord MT-315 resin-based lid adhesive. The lid adhesive is applied in a predetermined dispense pattern in which some lid adhesive is applied to the substrate and other lid adhesive is applied to the die. It has been observed that when the lid adhesive is applied to the substrate, resin bleeds out of the lid adhesive and flows through to the bottom side of the substrate.

Dispensing resin-based lid adhesive directly over a ceramic substrate accelerates resin bleed-out. The capillary effect of the ceramic surface roughness drives the resin away from the adhesive matrix. The ceramic substrate essentially sucks up the resin from the adhesive. Previous solutions to this problem include the addition of a metal strip running around the edges of the substrate, which is intended to act as a barrier to prevent resin bleed-out at the edges of the substrate. This metal strip has proven to be ineffective for drastic bleed-out amounts.

Also, the metal strip does not prevent resin bleed-out through the bottom of the substrate. The bottom of the substrate comprises land grid array (LGA) pads that are electrically connected to the die. The resin that bleeds out of the lid adhesive on the top side of the substrate flows through the substrate and wicks up the LGA pads. This resin bleed out is a defect that cannot be left on the device after assembly. The resin bleed-out 02 must be manually erased from the LGA pads before the device is tested.

One disadvantage of the prior art is the loss in manufacturing time caused by the need to clean the resin bleed-out from the package. Flip chip microprocessors and similar semiconductor devices are produced in a high volume. Detecting and cleaning resin bleed-out cause production delays and requires extra personnel, which adds to the cost of production. Each device must be visually inspected for resin bleed-out, failed parts must be separated out, resin bleed-out must be erased from the device, and debris from the resin bleed-out erasures must be cleaned from the device.

A second disadvantage caused by resin bleed-out is potential contamination of the test board used to test the completed devices. If resin bleed-out remains on the LGA pads and the device is placed in a socket on a test board, the resin is likely to transfer to the test socket, which, in turn, could also contaminate all subsequently tested devices.

SUMMARY OF THE INVENTION

These and other problems are generally solved or circumvented, and technical advantages are generally achieved, by preferred embodiments of the present invention in which lid adhesive is applied to gold surfaces formed on a semiconductor substrate, thereby minimizing resin bleed-out contamination from the adhesive.

In accordance with a preferred embodiment of the present invention, a method for assembling semiconductor devices comprises applying a first gold surface to a substrate, and applying lid adhesive to the first gold surface. A second gold surface may also be applied to the substrate, wherein the second gold surface is separated from the first gold surface by a trench or gap. The trench is adapted to act as a reservoir for resin bleed-out from the lid adhesive. The trench may have a linear or non-linear shape.

In accordance with another preferred embodiment of the present invention, a semiconductor device comprises a die mounted on a substrate. A first gold surface and a second gold surface formed on the substrate, and lid adhesive applied to at least the first gold surface. A heat sink lid is bonded to the lid adhesive. The lid adhesive is prevented from contacting the substrate by the first and second gold surfaces. A trench or gap is formed between the first gold surface and the second gold surface. The gap may have a serpentine shape to increase its length and overall contact surface area that acts as a greater obstacle for the resin to overcome. The gap is adapted to act as a reservoir for resin that bleeds out of the lid adhesive as well.

An advantage of a preferred embodiment of the present invention is containment of resin bleed-out during flip chip assembly.

A further advantage of a preferred embodiment of the present invention is the prevention of resin contamination on the LGA pads due to resin bleed-out. Moreover, the elimination of resin bleed-out prevents contamination of the test socket used during the manufacturing of the flip chip device.

Additionally, it is an advantage of the present invention to eliminate lost production time that was required to clean resin bleed-out from flip-chip devices and to provide a product with a higher reliability and quality.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely the manufacture of flip chip semiconductor microprocessors. The invention may also be applied, however, to any flip chip assembly or other device in which resin-based adhesive is used on a ceramic or porous substrate.

Figure 1:
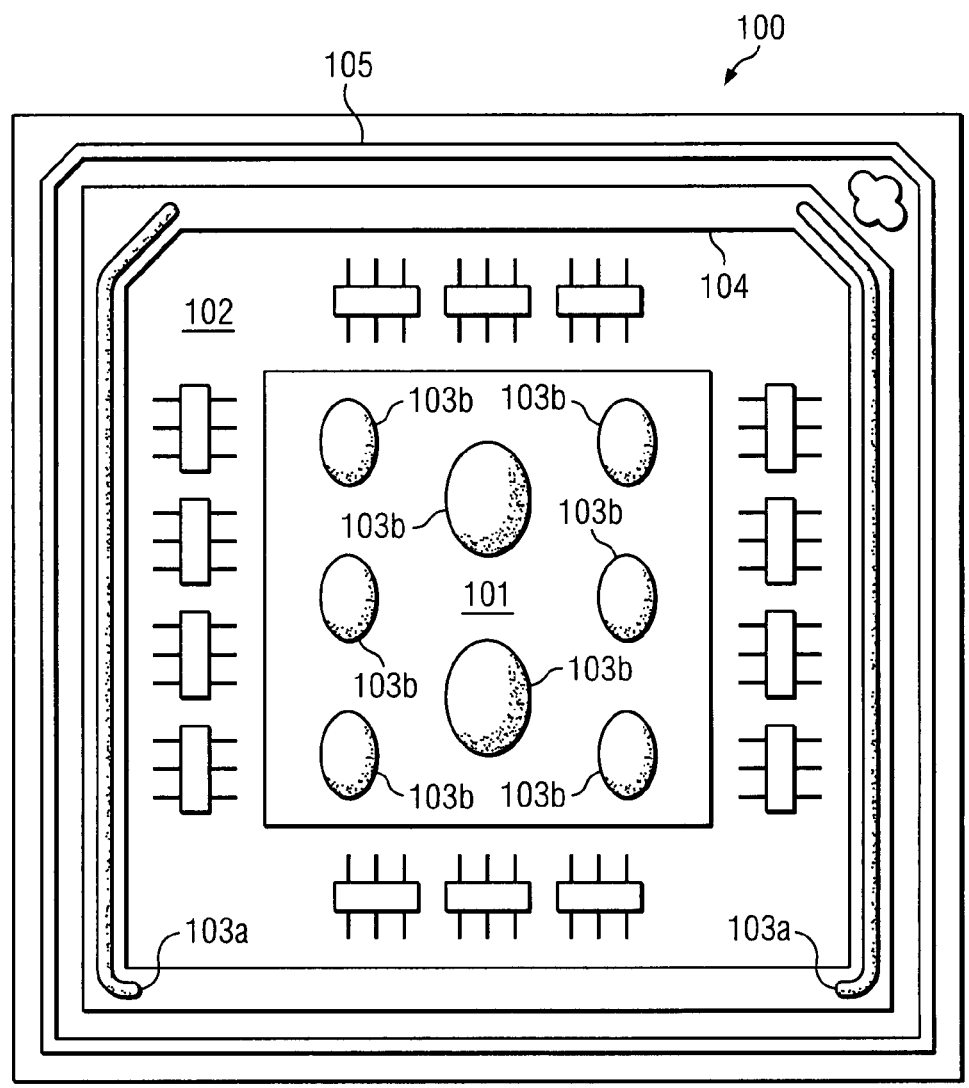
FIG. 1 is an exemplary embodiment of the present invention showing lid adhesive applied to gold surfaces on the substrate.

FIG. 1 is an exemplary embodiment of the present invention in which device 100 comprises die 101 bonded to substrate 102. Lid adhesive 103a and 103b has been applied to device 100; however, instead of being applied directly to substrate 102, adhesive 103a is applied over gold surface 104. Dispensing adhesive 103a directly over gold surface 104 inhibits and contains resin bleed-out. Gold is used for surface 104 because gold is already used as part of the microprocessor semiconductors manufacturing process. Accordingly, the only critical change to implement this embodiment is to modify the plating mask so that gold surface 104 is created on substrate 102. The bonding strength of lid adhesive to a gold surface is at least as strong as that of lid adhesive to a ceramic substrate surface. Outer ring 105 may be included to act as a barrier to resin bleed-out at the edges of substrate 102.

Figure 2:
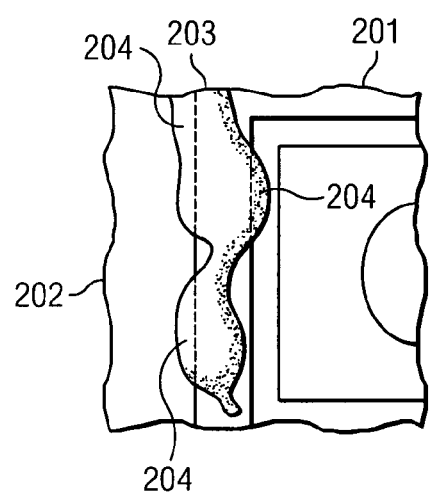
FIG. 2 is an exemplary embodiment of the invention showing partial resin bleed-out when the lid adhesive contacts the substrate.

FIG. 2 illustrates the situation in which the lid adhesive is not accurately applied to the gold surface and, as a result, partially touches the substrate. Gold surface 201 has been formed on substrate 202. Lid adhesive 203 is applied over gold surface 201, but in places has been allowed to touch substrate 202 thereby causing resin bleed-out 204. The present invention significantly reduces contamination from resin bleed-out even in cases where the bleed-out has not been entirely eliminated. In one embodiment, the width of gold surface 201 can be increased to reduce incidents wherein the lid adhesive overlaps surface 201 and contacts the substrate. It will be understood by those of skill in the art that the size and placement of gold surface 201 may have an effect on the operation of the semiconductor device and that effects such as interference, coupling, and the like must be evaluated before the final design of gold surface 201 is selected.

Figure 3:
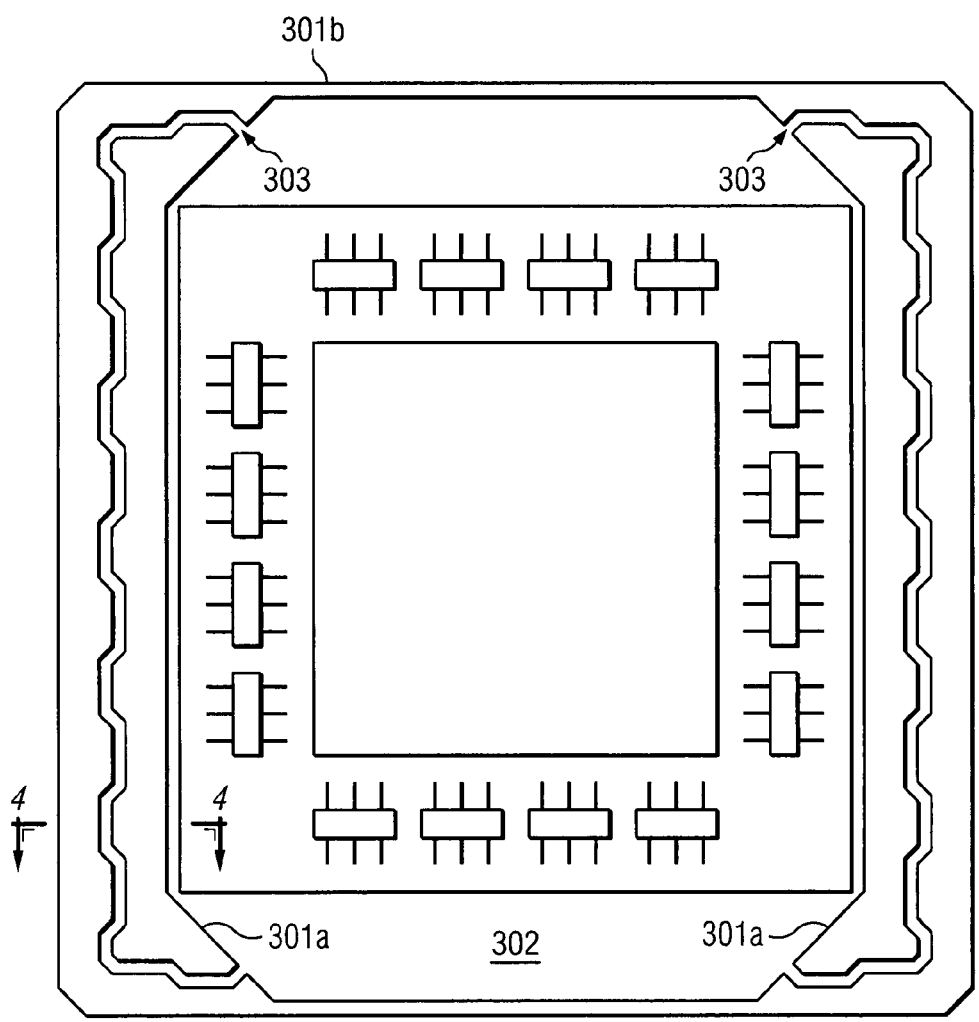
FIG. 3 is an alternative exemplary embodiment of the invention incorporating a gap or trench between gold surfaces.

FIG. 3 is an alternative embodiment in which gold surfaces 301a and 301b are formed on substrate 302. Trench or gap 303 is formed between gold surfaces 301a and 301b and acts as a resin reservoir that reduces the amount of resin available for contamination. Trench 303 has the following dimensions: height (Z) that is equal to the thickness of the gold rings; distance (W) between gold rings 301a and 301b; and length (Y) of trench 303. The volume ($V_R$) of the reservoir is equal to the product of the trench height, width, and length parameters ($V_R = Z \cdot W \cdot Y$), which corresponds to the amount of excess resin that can be collected in trench 303. The volume of trench 303 can be increased by increasing the value of Y, the trench length. As shown in FIG. 3, the length (Y) of trench 303 can be increased by giving the trench a curving or serpentine shape rather than straight line edges.

Figure 4:
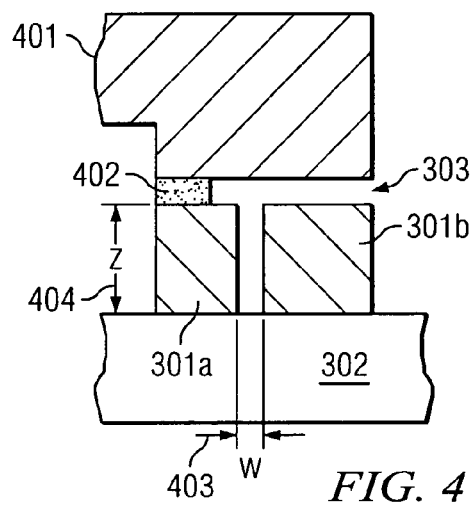
FIG. 4 is a cross section view of the gold surfaces of FIG. 5 illustrating aspects of the trench between the gold surfaces.

FIG. 4 shows cross section 4-4 of FIG. 3 in which heat sink lid 401 is attached using lid adhesive 402. Lid adhesive 402 is applied to gold surface 301a. If lid adhesive 402 spreads to trench 303, resin bleed-out will be contained within trench 303 to minimize contamination of the resin bleed-out. FIG. 4 also shows the dimensions of trench 303 width (W) 403 and height (Z) 404.

Figure 5:
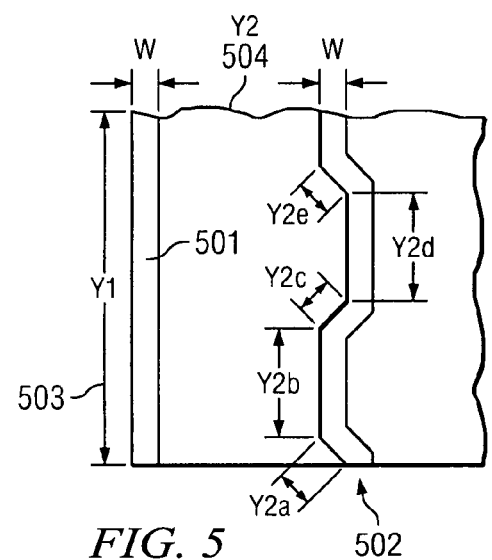
FIG. 5 is a diagram illustrating the dimensions of the trench in an exemplary embodiment of the invention.

FIG. 5 is a top view of resin bleed-out trenches 501 and 502. Trench 501 has straight sides with a length Y1 (503). Trench 502 illustrates how the length and, therefore, the volume can be increased by forming trench 502 with a non-linear, curving, or serpentine shape. The length Y2 (504) of trench 502 is made up of components $Y2a + Y2b + Y2c + Y2d + Y2e$. Accordingly, even though trench 502 covers the same horizontal distance as trench 501, it has a longer length and a greater volume to contain excess adhesive and resin bleed-out.

Although the present invention and its advantages have been described in detail, it should be understood that various changes, substitutions and alterations can be made herein without departing from the spirit and scope of the invention as defined by the appended claims. By adding the gold surfaces shown in FIGS. 1-3, the cycle time and productivity efficiency for flip chip assembly are improved by eliminating cleaning steps for resin bleed-out. This also provides a cost reduction by reducing the risk of resin bleed-out contamination during burn-in testing and eliminating personnel required for cleaning resin bleed-out. The anti-resin bleed-out concepts disclosed herein are applicable to the assembly of any semiconductor package that utilizes resin-based adhesives.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for assembling semiconductor devices comprising:
   applying a first gold surface to a substrate;
   applying lid adhesive to the first gold surface; and
   applying a second gold surface to the substrate, wherein the second gold surface is separated from the first gold surface by a trench.

2. The method of claim 1 wherein the trench is adapted to act as a reservoir for resin bleed-out from the lid adhesive.

3. The method of claim 1 wherein the trench has straight sides that are parallel to an edge of the substrate.

4. The method of claim 1 wherein the trench has a serpentine shape.

5. The method of claim 1 wherein the first gold surface and second gold surface are applied by a masking process.

6. The method of claim 1 wherein the substrate is a ceramic material.

7. The method of claim 1 wherein the first gold surface has a width selected to prevent the lid adhesive from touching the substrate.

* * * * *